United States Patent [19]

Itoh et al.

[11] Patent Number: 5,113,232
[45] Date of Patent: May 12, 1992

[54] LED ARRAY CHIPS WITH THERMAL CONDUCTOR

[75] Inventors: Masahiro Itoh, Tokyo; Masayuki Kuwabara, Kanagawa, both of Japan

[73] Assignee: Eastman Kodak Company, Rochester, N.Y.

[21] Appl. No.: 719,406

[22] Filed: Jun. 24, 1991

[30] Foreign Application Priority Data

Jul. 31, 1990 [JP] Japan ................... 2-202849

[51] Int. Cl.$^5$ ............................................. H01L 33/00
[52] U.S. Cl. ........................................ 357/17; 357/45; 357/68; 357/81; 357/53; 357/54
[58] Field of Search ................. 357/17, 45, 81, 68, 357/71, 53, 54

[56] References Cited

U.S. PATENT DOCUMENTS

| | | | |
|---|---|---|---|
| 3,492,548 | 1/1970 | Goodman | 357/17 X |
| 3,566,215 | 2/1971 | Heywang | 357/17 X |
| 4,716,568 | 12/1987 | Scifres et al. | 357/81 X |
| 5,045,895 | 9/1991 | Yoshida et al. | 357/17 |

FOREIGN PATENT DOCUMENTS 54-107289  8/1979  Japan ................... 357/17

Primary Examiner—William Mintel
Attorney, Agent, or Firm—Raymond L. Owens

[57] ABSTRACT

The present invention is directed to an LED array chip which includes a plurality of LEDs which are integrated thereon and has a thermal conductor on the array chip in the vicinity of, and on the same side as a light emitting surface of each LED on the array chip. The thermal conductor extends away from each LED and is connected to a radiating member such as a heat sink which is provided outside of the array chip. The thermal conductor can be electrically conductive, and in such case can be electrically connected to an electrode on a surface of the array chip opposite to the light emitting surfaces of the plurality of LEDs.

10 Claims, 1 Drawing Sheet

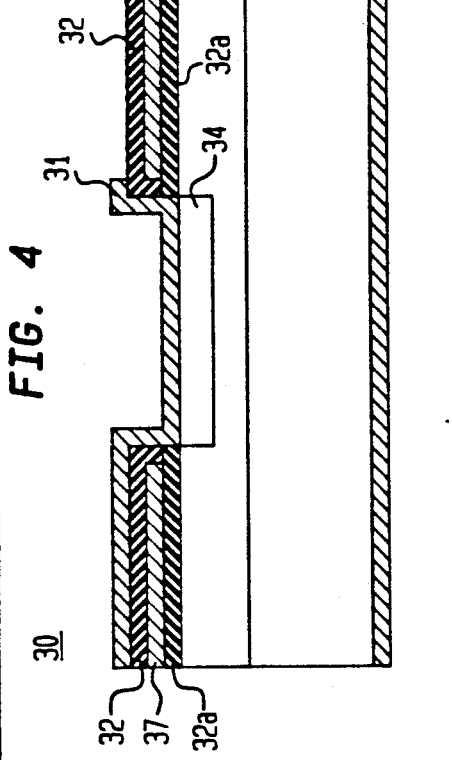
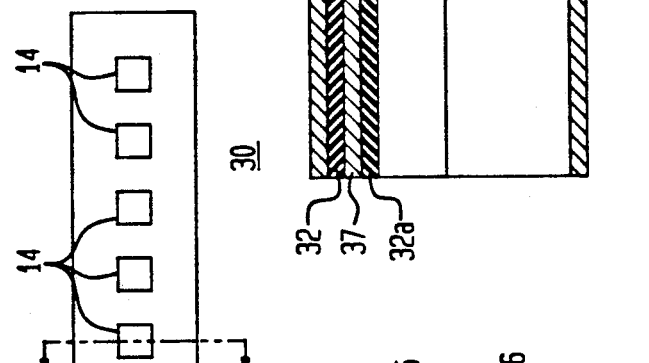
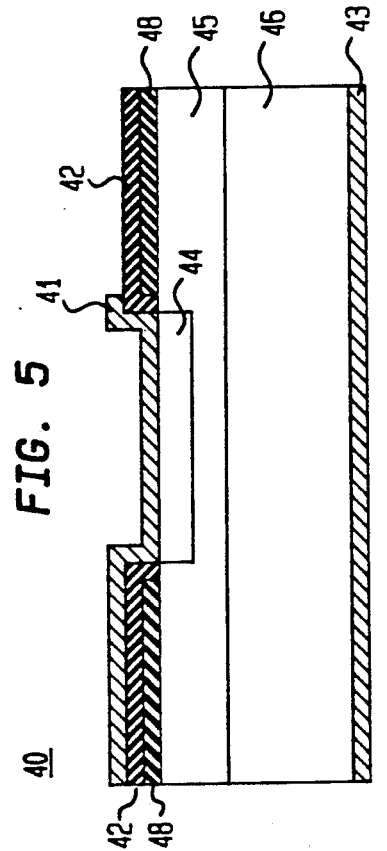
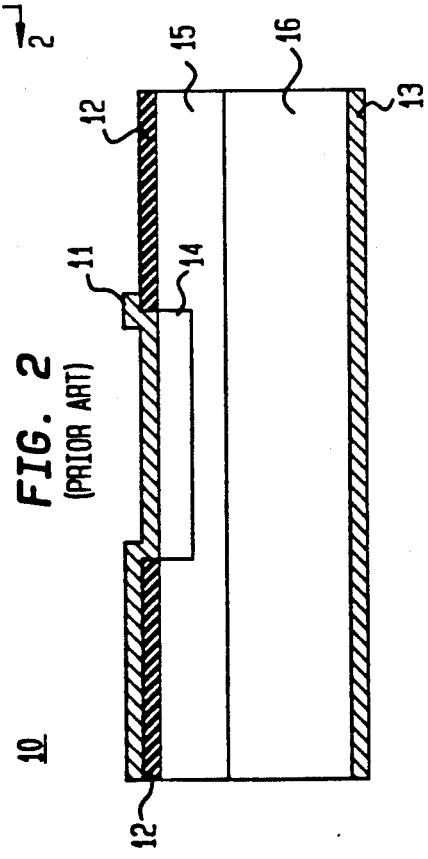
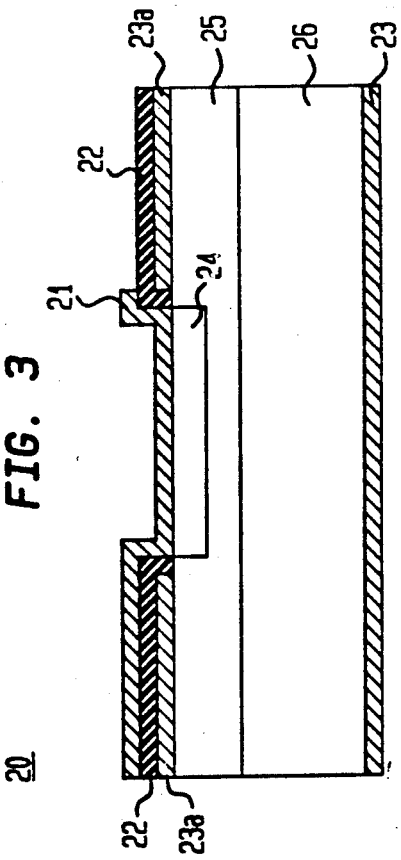

LED ARRAY CHIPS WITH THERMAL CONDUCTOR

FIELD OF THE INVENTION

The present invention is directed to Light Emitting Diode (LED) array chips for use with, for example, an LED printer head, and more particularly, to an LED array chip capable of efficiently radiating the heat generated when the LED array emits light.

BACKGROUND OF THE INVENTION

Referring now to FIG. 1, there is shown a configuration of a conventional LED array chip 10. Formed on the LED array chip 10 are a plurality of LED elements each having a light emitting layer 14.

Referring now to FIG. 2, there is shown a cross-sectional view of the LED array chip 10 along the dashed line 2—2 of FIG. 1. The LED array chip 10 comprises an upper electrode 11, an insulating layer 12, a lower electrode 13, the light emitting layer 14, an epitaxial layer 15, and a substrate 16. The epitaxial layer 15 is formed on a major surface of the substrate 16. The upper electrode 11 is connected to the light emitting layer 14 which extends from an upper surface of the epitaxial layer 15 into the epitaxial layer 15. The lower electrode 13 is formed on the other opposing major surface of the substrate 16 opposite to the light emitting layer 14. In the conventional LED array chip 10, when the LED array emits light, a large part of the heat evolved therefrom is released outwardly from the chip 10 essentially from the lower electrode 13 which is formed on a major surface of the substrate 16 opposite to the light emitting layer 14.

The conventional LED array chip 10 presents the following problems. As discussed hereinabove, a large portion of the heat generated at the time of light emission from the light emitting layer 14 is radiated from the lower electrode 13 via the substrate 16 which has a relatively low thermal conductivity. For this reason, the heat generated when the array emits light is not radiated with high efficiency. This results in an increase in temperature of the LED array. Such increase in temperature causes a decline in the light emitting output of the LED array and fluctuations in the light emitting wavelength thereof. Additionally, the useful lifetime of the LED array decreases because of the increase in temperature.

SUMMARY OF THE INVENTION

The present invention is directed to a Light Emitting Diode (LED) array chip capable of efficiently releasing the heat generated when the LED array emits light. More particularly, the LED array chip comprises a plurality of LEDs and a thermal conductor. The plurality of LEDs are integrated on a major surface of the array chip. Each LED comprises a light emitting surface which is substantially aligned with the major surface of the array chip. The thermal conductor is formed on a surface of the array chip on the same side as the plurality of LEDs and extends to a position adjacent to, but not in contact with, the light emitting surface of each LED. The thermal conductor is used to efficiently remove the heat evolved from light emissions by the LEDs.

The present invention is further directed to an LED array chip comprising a plurality of LEDs, a plurality of electrodes, a thermal conductor, and an insulation layer. The plurality of LEDs are integrated on a major surface of the array chip. Each LED comprises a light emitting surface which is substantially aligned with the major surface of the array chip. Each of the plurality of electrodes are connected to the light emitting surface of a separate one of the LEDs. The thermal conductor is formed on a surface of the array chip on the same side as the plurality of LEDs and extends to a position adjacent to, but not in contact with, the light emitting surface of each LED. The insulation layer is disposed for providing insulation between the thermal conductor and each of the electrodes and the light emitting surfaces.

The invention is still further directed to a method of manufacturing an LED array chip. A first step of the method involves integrating a plurality of LEDs on a first major surface of the array chip such that a light emitting surface of each LED is substantially aligned with the major surface of the array chip. A second step of the method involves forming a thermal conductor on the major surface of the array chip, the thermal conductor extending to a position adjacent to, but not in contact with, the light emitting surface of each LED so as not to influence light emissions from each LED.

The invention will be better understood from the following more detailed description taken with the accompanying drawings and claims.

BRIEF DESCRIPTION OF THE DRAWINGS

FIG. 1 is a plan view showing a conventional (prior art) Light Emitting Diode (LED) array chip;

FIG. 2 is a cross-sectional view of the conventional LED array chip of FIG. 1 taken along a dashed line 2—2 of FIG. 1;

FIG. 3 is a cross-sectional view of an LED array chip in accordance with a first embodiment of the present invention;

FIG. 4 is a cross-sectional view of an LED array chip in accordance with a second embodiment of the present invention; and FIG. 5 is a cross-sectional view of an LED array chip in accordance with a third embodiment of the present invention.

The drawings are not necessarily to scale.

DETAILED DESCRIPTION

Referring now to FIG. 3, there is shown a cross-sectional view of part of an LED array chip 20 in accordance with a first embodiment of the present invention. The LED array chip 20 comprises an upper electrode 21, an insulating layer 22, a lower electrode 23, an upper electrode 23a, a light emitting layer 24, an epitaxial layer 25, and a substrate 26. LED array chips typically comprise a plurality of layers 24 (LEDs) which are separated from each other by portions of the epitaxial layer 25. It is to be understood that the components with the reference numbers 21, 22, 23, 24, 25 and 26 are equivalent to the components with the reference numbers 11, 12, 13, 14, 15 and 16, respectively, shown in FIG. 2.

In the LED array chip 20, the lower electrode 23, the light emitting layer 24, the epitaxial layer 25 and the substrate 26 are formed as in the LED array chip 10 of FIG. 2. Additionally, an electrode 23a is formed on an upper surface of the epitaxial layer 25 in the vicinity of, but not contacting, the light emitting layer 24. The electrode 23a is electrically connected via a means (not shown) such as a wire to the lower electrode 23. The electrode 23a is formed in a position near (adjacent to), but not in contact with, the light emitting portion of layer 24, and within such a range, so as not to exert any substantial influence on the light emission from each light emitting layer 24 of the LED array. An insulating layer 22 is formed on the electrode 23a to provide an insulation between the electrode 23a and the upper electrode 21 and the light emitting layer 24. The electrode 23a is also connected to a radiating member (not shown) such as a heat sink disposed outwardly of the chip 20. The heat generated when the light emitting layer 24 emits light is efficiently transferred to the electrode 23a and, in turn, to the radiating member for release to the outside.

In accordance with the embodiment of FIG. 3, the heat evolved when the LED emitting layers 24 of the LED array emit their light can be efficiently released from the vicinity of the light emitting portion of the chip 20. This permits the heat generated when emitting the light to be released to the outside with a high degree of efficiency. Additionally, a rise in temperature of the LED array due to the heat from the light emissions is moderated. Such efficient heat removal limits a decline in the light emitting output of the LED array, and fluctuations in the light emitting wavelength thereof. Additionally, it extends the useful lifetime of the LED array by the efficient removal of the heat evolving from the light emissions from the light emitting layers 24. In the embodiment of FIG. 3, the thermal conductor 23a for releasing the heat generated by the light emitting layer 24 from the vicinity thereof is also used as an electrode which is connected to lower electrode 23. Therefore, it becomes possible to use only the light emitting surface of the LED array chip 20 for removal of the heat evolving from the light emissions instead of the lower electrode 23, as occurs with the lower electrode 13 of the prior art arrangement of FIG. 2.

Referring now to FIG. 4, there is shown a cross-sectional view of a portion of an LED array chip 30 in accordance with a second embodiment of the present invention. The LED array chip 30 comprises an upper electrode 31, a first insulating layer 32, a second insulating layer 32a, a lower electrode 33, a light emitting layer 34, an epitaxial layer 35, a substrate 36, and a metallic layer 37. It is to be understood that the components with the reference numbers 31, 32, 33, 34, 35 and 36 are equivalent to the components with the reference numbers 11, 12, 13, 14, 15 and 16, respectively, shown in FIG. 2. In the embodiment of the LED array chip 30 of FIG. 4, the insulating layer 32, the lower electrode 33, the light emitting layer 34, the epitaxial layer 35, and the substrate 36 are formed in the same relationship as the components 12, 13, 14 15, and 16, respectively, in the LED array chip 10 of FIG. 2. The metallic layer 37, which exhibits good thermal conduction and is a good electrical conductor, is sandwiched between the insulating layers 32 and 32a. This metallic layer 37 is formed in a position close to, but not in contact with, the light emitting portion of each LED, and within a range so as not to exert any substantial influence on the light emission from each light emitting layer 34 of the LED array. The insulating layer 32 is formed over the metallic layer 37 and covers an end thereof where it contacts insulation layer 32a. Accordingly, layers 32 and 32a provide insulation between the layer 37 and the upper electrode 31 and the light emitting layer 34. The metallic layer 37 is connected to a radiating member (not shown) such as a heat sink disposed outwardly of the chip 40. The metallic layer 37 can also be connected to the lower electrode 33 by a means (not shown) such as a wire in the manner described for connecting electrode 23a to lower electrode 23 of FIG. 3.

In accordance with the embodiment of FIG. 4, the heat evolved when the LED emitting layers 34 of the LED array emit their light can be efficiently released from the vicinity of the light emitting portion of the chip 30. This permits the heat generated when the LEDs emit the light to be released to the outside of the array chip 30 with a high degree of efficiency. Additionally, a rise in temperature of the light emitting layers 34 of the LED array, which is due to the heat from the light emissions, is moderated. The efficient heat release also limits a decline in the light emitting output of the LED array, and fluctuations in the light emitting wavelength thereof. Additionally, it extends the useful lifetime of the LED array by the efficient removal of the heat evolving from the light emissions from the light emitting layers 34. The thermal conduction of metallic layer 37 for releasing the heat generated by the light emitting layers 34 from the vicinity thereof can also used as an electrode which is connected to lower electrode 33. Therefore, it becomes possible to use only the light emitting surface of the LED array chip 30 for removal of the heat evolving from the light emissions instead of the lower electrode 33, as occurs with the lower electrode 13 of the prior art arrangement of FIG. 2.

Referring now to FIG. 5, there is shown a cross-sectional view of part of an LED array chip 40 in accordance with a third embodiment of the present invention. The LED array chip 40 comprises an upper electrode 41, an insulating layer 42, a lower electrode 43, a light emitting layer 44, an epitaxial layer 45, a substrate 46, and an upper alloy layer 48. It is to be understood that the components with the reference numbers 41, 42, 43, 44, 45 and 46 and 48 have the same arrangement as the components with the reference numbers 21, 22, 23, 24, 25, 26, and 23a, respectively, shown in FIG. 3. The difference is that the alloy layer 48 is thermally conductive but not electrically conductive as found with thermal layer 23a. A radiating member (not shown), provided outside of the LED array chip 40, is connected to the alloy layer 48 to provide for heat radiation transmitted by the layer 48. The insulating layer 42 is formed on the alloy layer 48 to provide an insulation between the alloy layer 48 and each of the light emitting layer 44 and the upper electrode 41. The alloy layer 48 is formed in the vicinity of, but not in contact with, the light emitting layer. The heat generated when light is emitted from the light emitting layers 44 of the LED array is released to the outside of the chip 40 via the alloy layer 48 located in the vicinity of each of the light emitting layers 44. As a result the same heat dissipation advantages as those found in with the LED array chip 20 or 30 of FIGS. 3 or 4, respectively, are found with the chip 40 of FIG. 5.

In accordance with the present invention, an LED array chip arrangement is provided wherein the heat produced by the emission of light from the LED array chip is radiated from the vicinity of the light emitting portions of the chip. The heat is thereby released with a high degree of efficiency. It is, therefore, possible to moderate a rise in temperature of the LED array resulting from the light emission heat. Such moderation of temperature rise in the LED array chip prevents (1) a decrease in the light emitting output of the LED array, (2) fluctuations in the light emitting wavelength of the LED array, and (3) a decrease in the useful lifetime of the LED array.

It is to be understood that the specific embodiments described herein are intended merely to be illustrative of the spirit and scope of the invention. Modifications can readily be made by those skilled in the art consistent with the principles of this invention. More particularly, any suitable arrangement which provides a means for efficiently removing the heat generated by an LED array from the vicinity of the light emissions of the light emitting layers of an LED array chip without influencing the light emissions from the light emitting layers can be used.

What is claimed is:

1. A Light Emitting Diode (LED) array chip comprising:
    a plurality of LEDs integrated on a major surface of the array chip, each LED comprising a light emitting surface which is substantially aligned with the major surface of the array chip; and
    a thermal conductor formed on a surface of the array chip on the same side as the plurality of LEDs and extending to a position adjacent to but not in contact with the light emitting surface of each LED, the thermal conductor being overcoated with an insulator and connected to a radiating member provided outwardly of the array chip.

2. The LED array chip of claim 1 further comprising:
    an electrode formed on a second major surface of the array chip opposite the light emitting surface of each LED; and
    the thermal conductor is electrically connected to the electrode.

3. The LED array chip of 1 wherein the thermal conductor extends to a position close to the light emitting surface of each LED without exerting any substantial influence on light emissions from each of the LEDs.

4. A Light Emitting Diode (LED) array chip comprising:
    a plurality of LEDs integrated on a major surface of the array chip, each LED comprising a light emitting surface which is substantially aligned with the major surface of the array chip;
    a plurality of electrodes, each electrode connected to the light emitting surface of a separate one of the LEDs;
    a thermal conductor formed on a surface of the array chip on the same side as the plurality of LEDs and extending to a position adjacent to, but not in contact with, the light emitting surface of each LED; and
    an insulation layer for providing insulation between the thermal conductor and each of the electrodes and the light emitting surfaces.

5. The LED array chip of claim 4 wherein the thermal conductor is connected to a radiating member provided outwardly of the array chip.

6. The LED array chip of claim 4 further comprising:
    a second electrode formed on a second major surface of the array chip opposite the light emitting surface of each LED; and
    the thermal conductor is electrically connected to the second electrode.

7. The LED array chip of claim 6 wherein the thermal conductor is also connected to a radiating member provided outwardly of the array chip.

8. The LED array chip of 4 wherein the thermal conductor extends to a position adjacent to, but not in contact with, the light emitting surface of each LED without exerting any substantial influence on light emissions from each of the LEDs.

9. The LED array chip of claim 4 wherein the insulation layer is formed on top of and around an edge nearest the light emitting surface of the thermal conductor.

10. The LED array chip of claim 9 further comprising a second insulation layer formed between the thermal conductor and the major surface of the array chip.

* * * * *